United States Patent
Fink (10) Patent No.: US 9,634,361 B2
(45) Date of Patent: *Apr. 25, 2017

(54) BATTERY SYSTEM AND ASSOCIATED METHOD FOR DETERMINING THE INTERNAL RESISTANCE OF BATTERY CELLS OR BATTERY MODULES OF SAID BATTERY SYSTEM

(71) Applicants: Robert Bosch GmbH, Stuttgart (DE); Samsung SDI Co., Ltd., Yongin-si, Gyeonggi-do (KR)

(72) Inventor: Holger Fink, Stuttgart (DE)

(73) Assignees: Robert Boasch GmbH, Stuttgart (DE); Samsung SDI Co., Ltd., Yongin-si, Gyeonggi-do (KR)

( * ) Notice: Subject to any disclaimer, the term of this patent is extended or adjusted under 35 U.S.C. 154(b) by 175 days.

This patent is subject to a terminal disclaimer.

(21) Appl. No.: 14/405,840

(22) PCT Filed: May 24, 2013

(86) PCT No.: PCT/EP2013/060758
§ 371 (c)(1),
(2) Date: Dec. 5, 2014

(87) PCT Pub. No.: WO2013/182439
PCT Pub. Date: Dec. 12, 2013

(65) Prior Publication Data
US 2015/0303532 A1    Oct. 22, 2015

(30) Foreign Application Priority Data
Jun. 8, 2012 (DE) .................... 10 2012 209 660

(51) Int. Cl.
*G01N 27/416* (2006.01)
*H01M 10/48* (2006.01)
(Continued)

(52) U.S. Cl.
CPC .......... *H01M 10/482* (2013.01); *G01K 13/00* (2013.01); *G01R 31/3624* (2013.01);
(Continued)

(58) Field of Classification Search
CPC ... G01R 31/36; G01R 31/3624; H01M 10/00; H01M 10/482
(Continued)

(56) References Cited

U.S. PATENT DOCUMENTS 6,037,778 A * 3/2000 Makhija ............ G01R 31/3631
324/427
6,094,030 A * 7/2000 Gunthorpe .......... H01M 10/425
320/116
(Continued)

FOREIGN PATENT DOCUMENTS

DE    10 2009 002 465 A1    10/2010
DE    10 2010 027 864 A1    12/2011

OTHER PUBLICATIONS

International Search Report corresponding to PCT Application No. PCT/EP2013/060758, mailed May 24, 2013 (German and English language document) (5 pages).

*Primary Examiner* — M'Baye Diao
(74) *Attorney, Agent, or Firm* — Maginot, Moore & Beck LLP (57) ABSTRACT

A method for determining the internal resistance of battery cells of battery modules of a battery includes measuring a first voltage of at least one battery cell of a first battery module at a first time. The first battery module is decoupled from the battery module string in response to a control signal. The first battery module is connected to the battery module string after the first voltage measurement to enable a change in the first voltage of the at least one battery cell in response to a current flowing through the first battery module. A second voltage is measured at a second time (Continued)

where the first battery module is connected to the battery module string for a predefined time interval. The internal resistance is determined with reference to a difference between the first and the second voltage and the current flowing through the first battery module.

10 Claims, 4 Drawing Sheets

(51) Int. Cl.
  *G01R 31/36* (2006.01)
  *G01K 13/00* (2006.01)
  *H01M 10/42* (2006.01)
(52) U.S. Cl.
  CPC ..... *G01R 31/3658* (2013.01); *G01R 31/3662* (2013.01); *H01M 2010/4271* (2013.01); *H01M 2220/20* (2013.01)
(58) Field of Classification Search
  USPC .................................................. 324/429, 430
  See application file for complete search history.

(56) References Cited

U.S. PATENT DOCUMENTS

| | | | | |
|---|---|---|---|---|
| 6,888,355 | B2* | 5/2005 | Kitazawa | G04C 10/00 324/426 |
| 7,129,706 | B2* | 10/2006 | Kalley | G01R 31/36 320/106 |
| 7,772,852 | B2* | 8/2010 | Fechalos | G01R 31/3662 324/426 |
| 7,902,828 | B2* | 3/2011 | Huang | G01R 31/3662 324/430 |
| 7,945,402 | B2* | 5/2011 | Aridome | G01R 31/3658 320/134 |
| 8,886,478 | B2* | 11/2014 | Fink | H02J 7/1446 320/125 |
| 8,933,702 | B2* | 1/2015 | Deveau | G01R 31/3631 324/429 |
| 2012/0119745 | A1 | 5/2012 | Deveau et al. | |

* cited by examiner

BATTERY SYSTEM AND ASSOCIATED METHOD FOR DETERMINING THE INTERNAL RESISTANCE OF BATTERY CELLS OR BATTERY MODULES OF SAID BATTERY SYSTEM

This application is a 35 U.S.C. §371 National Stage Application of PCT/EP2013/060758, filed on May 24, 2013, which claims the benefit of priority to Serial No. DE 10 2012 209 660.4, filed on Jun. 8, 2012 in Germany, the disclosures of which are incorporated herein by reference in their entirety.

The present disclosure relates to a method for determining the internal resistance of battery cells or of battery modules of a battery which has a battery module string with a plurality of series-connected battery modules. In particular, the disclosure relates to a method for determining the internal resistance of battery cells or of battery modules of such a battery, the battery modules of which are designed to be selectively switchable into a connected state, in which a respective battery module contributes to an output voltage of the battery module string, or into a disconnected state, in which the respective battery module is decoupled from the battery module string, by means of control signals. The disclosure also relates to a battery system which is designed to perform the method according to the disclosure.

BACKGROUND

Batteries for use in hybrid and electric vehicles are known from the prior art, said batteries being referred to as traction batteries since they are used to feed electrical drives.

Figure 1:
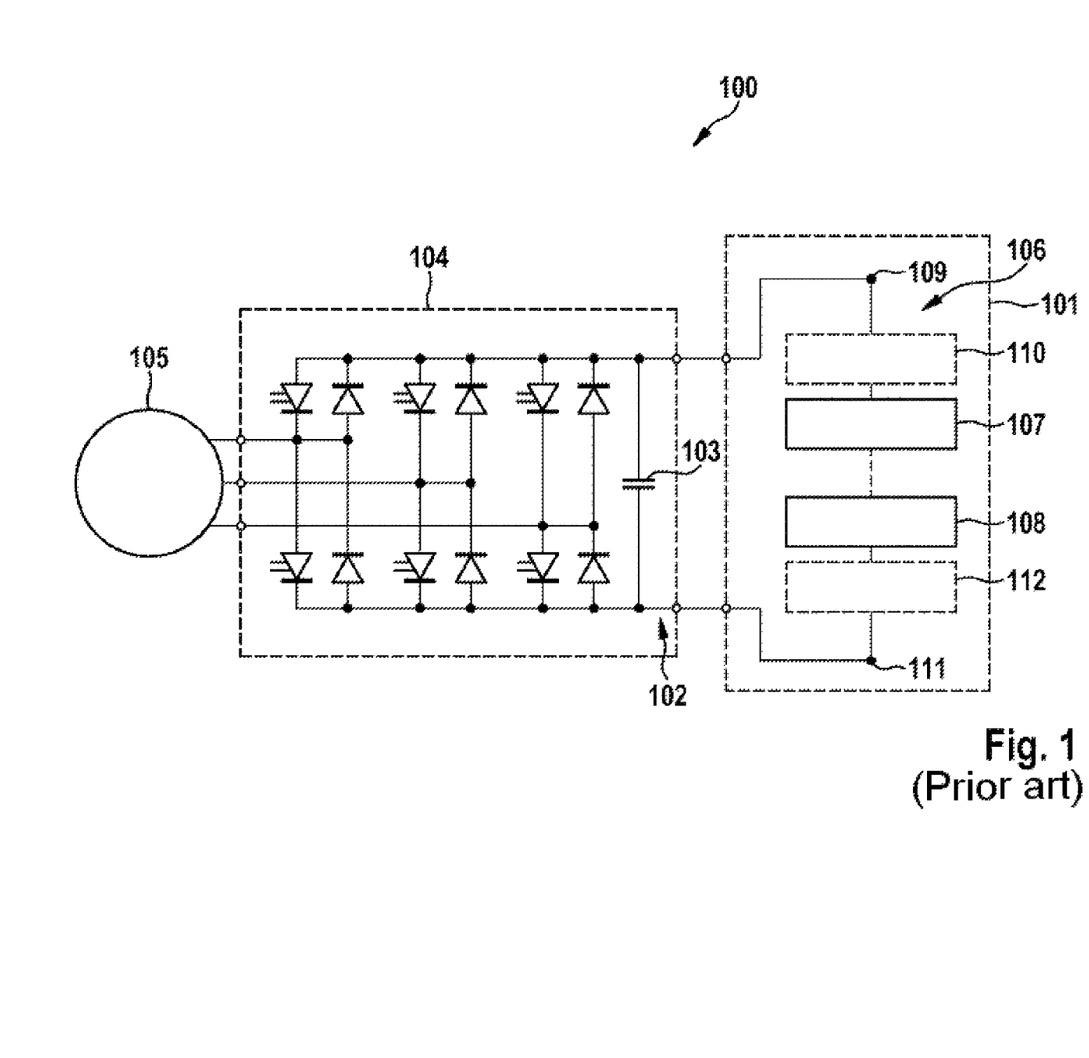
FIG. 1 shows a basic circuit diagram of a battery module string of a battery direct converter, which provides a battery output voltage that can be set in a stepped fashion, according to the prior art.

In previous patent applications from the applicant, drive systems which in each case have a battery system with an output voltage that can be set in a stepped fashion and which are used nowadays, for example, in electric and hybrid vehicles or in stationary applications, such as in the case of rotor blade adjustment in wind turbines, are described. An example of such a battery system is illustrated in FIG. 1.

A battery system 100 comprises a battery 101 which is connected to a DC voltage intermediate circuit 102 which comprises a capacitor 103. The DC voltage intermediate circuit 102 is integrated in a pulse-controlled inverter 104 contained in the battery system 100, via which pulse-controlled inverter sinusoidal voltages, which are phase-shifted with respect to one another, for the operation of a three-phase electric motor (electric drive motor) 105 are provided at three outputs in each case by means of two switchable semiconductor valves (not marked) and two diodes (not marked). The capacitance of the capacitor 103 is in this case designed to be sufficiently large in order to stabilize the voltage in the DC voltage intermediate circuit 103 for an interval in which one of the switchable semiconductor valves is turned on.

The battery 101 comprises a battery module string 106 with a plurality of series-connected battery modules, of which only two battery modules 107, 108 are illustrated in the drawing. A charging and disconnecting device 110 is connected between the battery module 107 and a positive pole 109 of the battery module string 106, which positive pole in this case forms a positive battery terminal. Optionally, a disconnecting device 112 can additionally be connected between the battery module 108 and a negative pole 111 of the battery module string 106, which negative pole in this case forms a negative battery terminal. The battery modules 107, 108 can have coupling devices (not illustrated) by means of which they can be selectively separately connected in each case to the battery module string 106 or decoupled from the battery module string 106, that is to say can be bypassed, in order thus to implement a battery system with an output voltage that can be set in a stepped fashion.

Battery management systems are used in traction batteries in order to ensure the safety of such a battery system, to exploit the capacity of the battery cells and to increase the service life of the battery cells. The core function of said battery management systems is a so-called battery state detection, which determines the present state of the battery cells. One of the essential items of information in this case is the internal resistance of the battery cells, which is determined as a function of the state of charge, the temperature of the battery cells and their state of aging. Such a method for characterizing battery cells is described in the initiative of the German Association of the Automobile Industry "Energy Storage System for HEV" and in the draft of ISO 12405.

Figure 2:
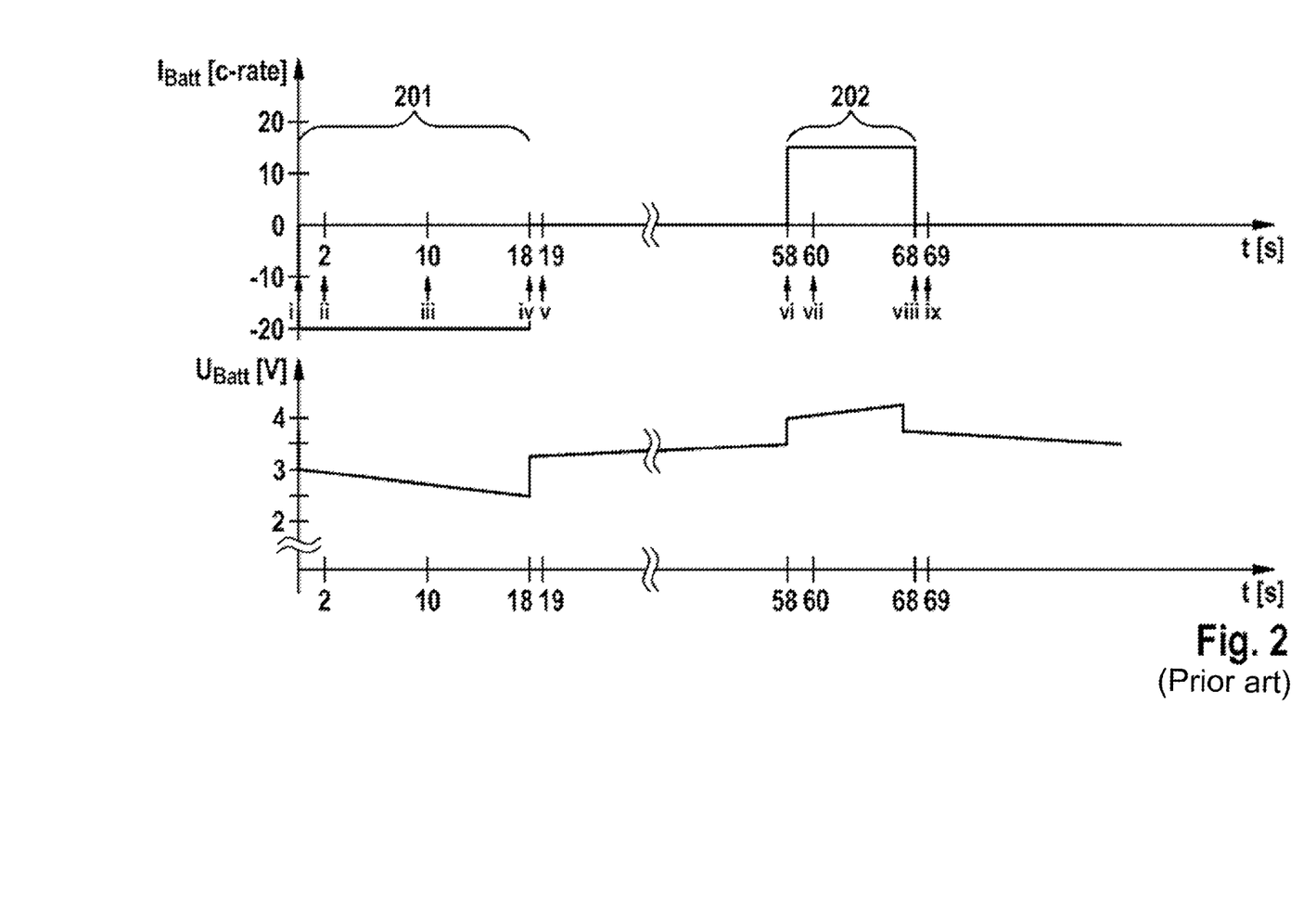
FIG. 2 shows a temporal profile of a battery current and of a battery cell voltage during a conventional method for determining the internal resistance of battery cells.

The basic principle of said method is illustrated in FIG. 2. In this case, FIG. 2 shows exemplary voltage changes of a battery voltage $U_{Batt}$ which is evaluated during a pulsed charging and discharging current $I_{Batt}$ of the battery. In this case, the current $I_{Batt}$ is plotted in units of a rate of charge c-rate ("current rate"). A discharging interval of the battery is denoted by the reference sign 201 and a charging interval of the battery is denoted by the reference sign 202. According to the method, the internal resistance $R_i$ of the battery cells is determined directly from the voltage and current differences of two instants under consideration. In this case, in FIG. 2, the measurement instants for the respective measurements of the battery voltage $U_{Batt}$ are numbered with Roman numerals. The indices of the voltage and current values given below relate to said measurement instants. By way of example, the internal resistance for a discharge lasting 10 seconds results from evaluating the voltage and current values at the measurement instants (i) at t=0 s and (iii) at t=10 s to give $$R_{i\_10s\_dch} = \frac{U_{III} - U_I}{I_{III}}. \qquad (1)$$

The internal resistance for a charging process lasting 10 seconds can correspondingly be calculated by evaluation of the voltage and current values at the instants (vi) at t=58 s and (viii) at t=68 s according to (2):

$$R_{i\_10s\_ch} = \frac{U_{VIII} - U_{VI}}{I_{VIII}}. \qquad (2)$$

This method is used when characterizing the cells on a testing bench. A disadvantage of the method is that it is difficult to comprehensively reproduce on the testing bench all conceivable real driving situations which could occur, for example, during operation of the battery in a motor vehicle. Therefore, the thus determined values for the internal resistance are useable for further processing in a battery management system in a vehicle only conditionally or only with the restriction of limited accuracy.

SUMMARY

According to the disclosure, a method is provided for determining the internal resistance of battery cells or of battery modules of a battery which has a battery module string with a plurality of series-connected battery modules. The battery modules are each designed to be selectively switchable into a connected state, in which a respective battery module contributes to an output voltage of the battery module string, or into a disconnected state, in which the respective battery module is decoupled from the battery module string, by means of control signals. In principle, the method has the following steps:

a) measuring a voltage of a battery module or at least one battery cell of a battery module at a first time, at which the battery module is not connected to the battery module string, b) connecting the battery module to the battery module string, with the result that a change in the voltage of the battery module or of the at least one battery cell occurs owing to a current flowing through the battery module, c) measuring the voltage of the battery module or the voltage of the at least one battery cell at a second time, at which the battery module has been connected to the battery module string for a predefined or selected time interval, and d) calculating a resistance value for the internal resistance of the battery module or for the at least one battery cell of the battery module on the basis of a difference between the voltage measured at the first time and the voltage measured at the second time and of the current value of the current flowing through the battery module.

Furthermore, according to another aspect of the disclosure, provision is made of a battery system having a battery which has a battery module string with a plurality of series-connected battery modules, which each comprise at least one battery cell and an actuable coupling unit. Furthermore, the battery system has a monitoring unit, in particular a cell supervision circuit (CSC), provided for monitoring the battery modules of the battery, which monitoring unit is designed to measure cell voltages and/or battery module voltages. In addition, the battery system has at least one current measuring unit which is interconnected with the battery module string. The battery modules are to each be able to be selectively connected to and decoupled again from the battery module string by means of the coupling units in order to generate a settable output voltage of the battery. Furthermore, the battery system has a control and readout unit, in particular a control and readout unit which is integrated into a battery management system, which is connected to the coupling units, to the at least one monitoring unit and to the current measuring unit. In this case, the battery system is designed to perform the method according to the disclosure for determining the internal resistance of battery modules or of battery cells of the battery system.

Thus, according to the disclosure, means are provided which are advantageously designed to determine the internal resistance of battery cells in or using battery systems with an output voltage that can be set in a stepped fashion. The specific functioning of a battery system with connectable battery modules is used to be able to determine the internal resistance of battery cells as simply and precisely as possible. This is made possible, in particular, by a sudden positive or negative excitation which occurs during operation of the battery and is in the form of a sudden current profile, which is applied to the battery cells by connecting or decoupling a battery module. In this case, a sudden response in the form of the voltage profile of the battery cells or battery modules is plotted and evaluated. In comparison with the present prior art, the method according to the disclosure for determining the internal resistance is more reliable and more precise. This is also due to the fact that it is made possible for the measurements to take place during real conditions during operation of the battery. This method is preferably used during operation in the vehicle. By contrast, the methods according to the prior art take place offline.

According to a development of the disclosure, the battery according to the disclosure has a plurality of battery module strings and is set up to generate, by actuating the coupling units by means of the battery module strings, AC voltages which are phase-shifted with respect to one another, in particular for operating a three-phase electric motor.

In this case, the function of a battery direct converter can be particularly expediently exploited, wherein connections and decouplings, which are performed for the generation of the phase-shifted AC voltages, of battery modules of the battery direct converter are used to perform the method according to the disclosure.

According to an embodiment of the method according to the disclosure, the current value of the current flowing through the battery module, which current is used to calculate the resistance value, is measured at the second time.

The method can be used in almost any operating situation. In particular, the method can be performed during a charging process of the battery or during a discharging process of the battery.

According to a development of the disclosure, the current profile of the battery current is also monitored during the connected state, in the case of which a measurement for determining the resistance is performed. To put it more precisely, it is determined in this case whether or not the level of a change in the current flowing through the battery module during the time interval in which the battery module is connected to the battery module string exceeds a predefined limit value. In the event that the limit value is exceeded, the present voltage measurement is discarded. The method may be repeated in order consequently to perform measurements with sufficiently stable current.

As a result, the reliability of the calculated resistance values can advantageously be further improved.

According to a particularly expedient embodiment of the disclosure, provision is made for a change in the open circuit voltage of the battery module or in the open circuit voltage of the at least one battery cell occurring during the predefined time interval to be determined. Consequently, the difference voltage value used in the calculation of the resistance value is optionally corrected by the value of the determined change. In this way, the accuracy of the method can be considerably increased.

It is preferred that, at least occasionally during operation of the battery, the steps according to the method are performed multiple times or even continually, under different boundary conditions, such as state of charge, temperature, level of the charging or discharging current, and/or with a respectively differently selected time interval between the first voltage measurement and the second voltage measurement.

As a result, it is made possible to obtain a characterization, which becomes more and more comprehensive and precise over the duration of use of the battery, of the battery with the associated internal resistance of all of the individual battery modules and/or battery cells. The measured data determined during the multiple performances of the method is preferably stored in the form of an internal resistance characteristic, wherein the characteristic can be continually expanded and updated.

According to an embodiment of the disclosure, after the measurement of the voltage at the second time has been performed and before the battery module is switched into the disconnected state again, one or more further measurements of the voltage of the battery module or of the voltage of the at least one battery cell of the battery module are additionally carried out. On the basis of the one measurement or plurality of further measurements, corresponding further values, associated with different measurement time intervals, are then determined for the internal resistance.

The battery according to the disclosure is preferably a lithium-ion battery.

In addition, provision is made according to the disclosure of a motor vehicle having an electric motor which has the battery system according to the disclosure. In this case, the battery system is connected to the electric motor.

Advantageous developments of the disclosure are specified in the dependent claims and described in the description.

BRIEF DESCRIPTION OF THE DRAWINGS

Exemplary embodiments of the disclosure are explained in more detail with reference to the drawings and the following description. In the drawings.

DETAILED DESCRIPTION

Figure 3:
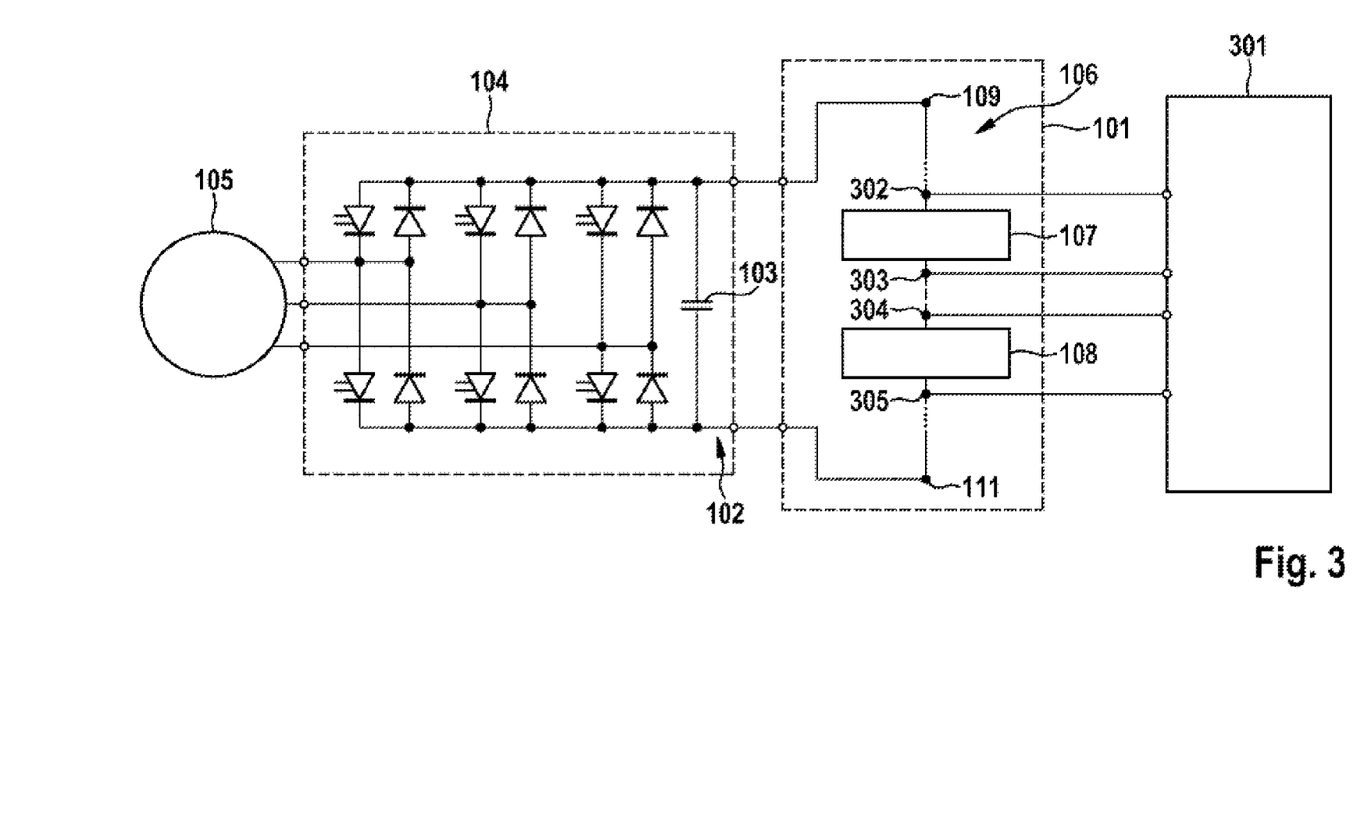
FIG. 3 shows an embodiment of the battery system according to the disclosure.

FIG. 3 shows an embodiment of the battery system 300 according to the disclosure. In contrast with the battery system 100 from FIG. 1, the battery system 300 which has been constructed according to the architecture of a battery direct converter, has a specifically adapted control and readout unit 301 which actuates and reads the cell monitoring units (not illustrated) and current sensors (not illustrated) of the battery system 300 according to the method according to the disclosure. This is done in coordination with an actuation of the battery modules 107, 108. FIG. 3 also illustrates terminals 302, 303, 304, 305 of the battery modules 107, 108, to or from which the battery cells (not illustrated) can be either connected or decoupled as modules, wherein, in the disconnected state of the battery module 107, for example, the associated terminals 302, 303 are connected, with the result that the battery module 107 is bypassed. At the same time, another battery module, for example the battery module denoted by reference sign 108, can be in a connected state in order to provide a battery module voltage across the associated terminals 304, 305. Without restriction to generality, at least one cell monitoring unit (not illustrated) is integrated in the control and readout unit 301 shown in FIG. 3, by means of which cell monitoring unit the battery module voltages and/or the cell voltages can be read across the battery module terminals.

Thus, according to the disclosure, the specific function of a battery direct converter or of a battery 101 with an output voltage that can be set in a stepped fashion can advantageously be used in a targeted manner to determine the internal resistance of the battery cells contained in a battery module 107, 108 of the battery direct converter. For this purpose, that battery module 107, 108 for the cells of which the internal resistances are to be determined is connected during operation. Hence, the current which flows through the battery cells of said battery module 107, 108 is suddenly increased from 0 to the present output current of the battery 100. The battery cells of the connected battery module 107, 108 respond to the sudden change in their current with a change in the cell voltage. This sudden response can be plotted together with the battery current in the battery management system. Hence, the necessary information for determining the internal resistance is available to the battery management system.

Figure 4:
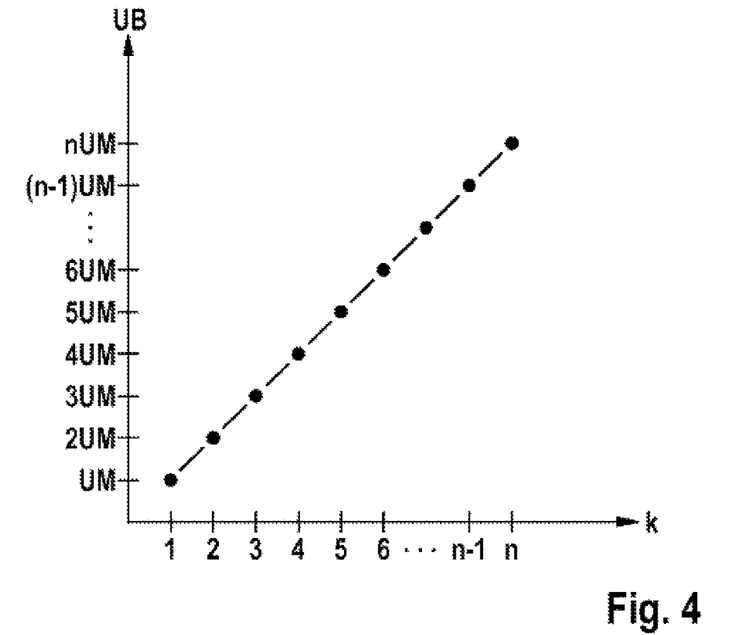
FIG. 4 shows a graph which illustrates the dependence of the output voltage UB of an exemplary battery used in the battery system according to the disclosure on the number k of the battery modules connected to a battery module string of the battery.

FIG. 4 shows by way of example the profile of the output voltage UB of the battery 101 as a function of the number k of battery modules 107, 108 connected to the battery module string 106 for the battery system 200 according to the disclosure shown in FIG. 3. The output voltage UB, illustrated as a function of the number k of battery modules 107, 108 connected to the battery module string 106, of the battery 101 is linear in this case and follows the relationship UB=k·UM, wherein 1<k<n. In this case, n is the maximum number of battery modules 107, 108 which can be connected to the battery module string. The maximum output voltage can then correspondingly assume the value n·UM, wherein the points in the shown linear voltage curve symbolize the individual measurements.

The battery modules 107, 108 are decoupled or connected according to the function of a battery direct converter. By way of example, a single battery module or a plurality of battery modules 107, 108 are connected and the rest of the battery modules 107, 108 are decoupled. Then, at least one or a plurality of the initially still decoupled battery modules 107, 108 are connected. An AC voltage can be generated according to this principle. In this case, the internal resistance of the battery modules 107, 108 is measured and evaluated simultaneously, that is to say at the same time. In this case, the momentaneous internal resistance in particular is also dependent on the power presently drawn from the battery or supplied to the battery, which in turn is dependent on the momentaneous operating situation of the battery and of the vehicle. A few examples of this are presented in the following text, which examples may be implemented respectively as alternatives to one another or partially also in combination.

According to an embodiment of the method according to the disclosure, for a discharging process of the battery 101, for example in the case of a motorway journey with electric drive and constant speed, a battery module 107, 108 is connected via the battery direct converter. The battery current and the voltages of the individual battery cells of the battery module 107, 108 are plotted. In this case, the internal resistance $R_i$ of the battery cells can be determined according to the formula:

$$R_{i\_xs\_dch} = \frac{U_{I+xs} U_I}{I_{I+xs}} \quad (3)$$

In this case, the index I denotes the instant at which the battery module 107, 108 in question is connected. Furthermore, the interval for which the battery module 107, 108 is already connected to the battery module string 106 during the measurement of the battery module current is x seconds. The instant I+xs is therefore x seconds after the connection instant I. Therefore, the internal resistance $R_i$ for, for example, a discharge lasting 2 seconds can be determined in this way as $R_{i\_2s\_dch}$.

In addition to the measurements performed during discharging processes (dch), the method can also be performed during charging processes (ch) in order to determine an associated internal resistance value $R_{i\_2s\_dch}$.

In the case of the method, the internal resistances for all individual cells of a battery module or battery system are preferably determined. Additionally or as an alternative, the battery module voltage can also be used instead of the voltage of the individual cells in order thus directly to determine the internal resistance of a battery module.

In the case of a particular embodiment of the method, additional requirements are placed on the current profile. By way of example, the current may not change by more than a given limit value during the evaluation time after the connection of the battery module. Said limit value can be selected, for example, on the basis of the level of the current, with the result that larger changes are permissible in the event of high currents than in the event of low currents, and vice versa.

According to a development of the disclosure, a characteristic with the data obtained during different measurements is stored for the battery system. Thus, a characterization of the internal resistance which is more and more accurate can be obtained with time, which characterization is in each case tailored precisely to the individual vehicle situation and the environment of the battery system. Thus, the internal resistances are stored as a function of the duration of the sudden loading, for example for loadings between 1 s and 30 s, and as a function of the level of the charging or discharging current and of the influence parameters state of charge and temperature. The characteristic is continually updated in order to have present information relating to the internal resistance for all operating areas.

According to an embodiment of the disclosure, a change in the open circuit voltage of the battery cell is determined during the measurement interval, wherein the difference voltage value used when calculating the resistance value is corrected by the value of the determined change. In this way, the circumstances can be taken into account that, in the case of greater or longer-lasting charging and discharging processes with high currents, the state of charge of the battery cells already changes during the interval which is used to determine the internal resistance such that the determination of the internal resistance is influenced by this. Thus, it can be taken into account that the no-load voltage or open circuit voltage (OCV) of the battery changes depending on the state of charge. According to the method, said change can be taken into account as follows:

$$R_i = \frac{\Delta U - \Delta OCV}{\Delta I} \quad (4)$$

In this case, $\Delta OCV$ is the determined change in the open circuit voltage, $\Delta U$ is the voltage difference between the voltage measurement at a first time when the battery module is connected and a second time, after the battery module had been connected for a predetermined interval, and $\Delta I$ is the corresponding difference in the battery module current or the battery module string current between the first time and the second time.

By way of example, in the case of the discharge pulse in FIG. 2 between t=0 s and t=18 s, a charge is assumed which corresponds to a relative change in the state of charge $\Delta SOC$ of 10%. The no-load voltage of a lithium-ion battery cell changes in the case of such a change in the state of charge depending on the initial state of charge in the region of approximately 100 mV to 280 mV, wherein the precise value is dependent on the technology. As a result, for example for a conventional 6 Ah lithium-ion cell which is used in hybrid vehicles, when the voltage change is subtracted, an internal resistance which is higher by the value $$\Delta R_{i\_18s\_dch} = \frac{\Delta OCV}{\Delta I} = \frac{100 \text{ mV} \ldots 280 \text{ mV}}{120 \text{ A}} \quad (5)$$
$$= 0.83 \text{ m}\Omega \ldots 2.33 \text{ m}\Omega$$

results. In comparison, the internal resistance of the battery cell which results after the subtraction of the change in the no-load voltage for the cell considered by way of example is approximately 2.2 m$\Omega$. Thus, in comparison to the conventional methods where the error may temporarily be more than 100%, in this embodiment of the disclosure, a significant improvement in the accuracy of the determination of the internal resistance can be achieved.

The invention claimed is:

1. A method for determining an internal resistance of battery cells of battery modules of a battery, comprising:
   measuring a first voltage of at least one battery cell of a first battery module of the battery modules at a first time, wherein the first battery module is decoupled from a battery module string in response to a first control signal;
   connecting, in response to a second control signal, the first battery module to the battery module string after the first voltage measurement to enable a change in the first voltage of the at least one battery cell in response to a current flowing through the first battery module;
   measuring a second voltage of the at least one battery cell at a second time after the connection of the first battery module to the battery module string, wherein the first battery module is connected to the battery module string for a predefined time interval; and
   determining the internal resistance after the measurement of the second voltage of the at least one battery cell with reference to (i) a difference between the first voltage and the second voltage and (ii) a current value of a current flowing through the first battery module.

2. The method as claimed in claim 1, further comprising:
   measuring a value of the current flowing through the battery module at the second time.

3. The method as claimed in claim 1, further comprising:
   determining the internal resistance of the at least one battery cell during a charging process of the battery or a discharging process of the battery.

4. The method as claimed in claim 1, further comprising:
   determining a level of a change in the current flowing through the first battery module during the predefined time interval;
   determining if the level of change exceeds a predefined limit value; and
   performing at least one of discarding the measured first battery voltage and the second battery voltage and measuring the first battery voltage and the second battery voltage if the level of change exceeds the predefined limit value.

5. The method as claimed in claim 1, further comprising:
determining a change in an open circuit voltage of the at least one battery cell occurring during the predefined time interval; and
modifying the difference between the first voltage and the second voltage with reference to the determined change in the open circuit voltage.

6. The method as claimed in claim 1, further comprising:
determining the internal resistance under varying boundary conditions, the boundary conditions including at least one of state of charge, temperature, level of the charging or discharging current, and a respectively differently selected time interval between the first voltage measurement and the second voltage measurement; and
storing the internal resistance determined during the varying boundary conditions in a form of an internal resistance characteristic.

7. The method as claimed in claim 1, further comprising:
measuring one or more voltages of the at least one battery cell after measuring the second voltage and before the battery module is decoupled from the battery module string; and
determining a plurality of internal resistances associated with different measurement time intervals and the corresponding measured one or more voltages.

8. A battery system, comprising:
a battery including a battery module string having a plurality of series-connected battery modules, each of the battery modules having at least one battery cell, and an actuable coupling unit, each of the battery modules are configured to be selectively connected to and decoupled from the battery module string with the coupling units to generate a settable output voltage of the battery;
at least one monitoring unit configured to monitor the battery modules and measure at least one of cell voltages and battery module voltages;
at least one current measuring unit interconnected with the battery module string; and
a control and readout unit connected to (i) the coupling units, (ii) the at least one monitoring unit, and (iii) the at least one current measuring unit, the control and readout unit is configured to:
measure a first voltage of the at least one battery cell of a first battery module of the battery modules at a first time, wherein the first battery module is decoupled from a battery module string in response to a first control signal;
connect, in response to a second control signal, the first battery module to the battery module string after the first voltage measurement to enable a change in the first voltage of the at least one battery cell in response to a current flowing through the first battery module;
measure a second voltage of the at least one battery cell at a second time after the connection of the first battery module to the battery module string, wherein the first battery module is connected to the battery module string for a predefined time interval; and
determine the internal resistance after the measurement of the second voltage of the at least one battery cell with reference to (i) a difference between the first voltage and the second voltage and (ii) a current value of a current flowing through the first battery module.

9. The battery system as claimed in claim 8, wherein the battery further includes:
a plurality of battery module strings configured to:
actuate the coupling units with the battery module strings
generate AC voltages, the AC voltages being phase-shifted with respect to one another and
determine the internal resistance with reference to the connections and decouplings of battery modules to generate the phase-shifted AC voltages.

10. A motor vehicle, comprising:
an electric motor; and
a battery system connected to the electric motor, the battery system including:
a battery including a battery module string having a plurality of series-connected battery modules, each of the battery modules having at least one battery cell, and an actuable coupling unit, each of the battery modules are configured to be selectively connected to and decoupled from the battery module string with the coupling units to generate a settable output voltage of the battery;
at least one monitoring unit configured to monitor the battery modules and measure at least one of cell voltages and battery module voltages;
at least one current measuring unit interconnected with the battery module string; and
a control and readout unit connected to (i) the coupling units, (ii) the at least one monitoring unit, and (iii) the at least one current measuring unit, the control and readout unit is configured to:
measure a first voltage of the at least one battery cell of a first battery module of the battery modules at a first time, wherein the first battery module is decoupled from a battery module string in response to a first control signal;
connect, in response to a second control signal, the first battery module to the battery module string after the first voltage measurement to enable a change in the first voltage of the at least one battery cell in response to a current flowing through the first battery module;
measure a second voltage of the at least one battery cell at a second time after the connection of the first battery module to the battery module string, wherein the first battery module is connected to the battery module string for a predefined time interval; and
determine the internal resistance after the measurement of the second voltage of the at least one battery cell with reference to (i) a difference between the first voltage and the second voltage and (ii) a current value of a current flowing through the first battery module.

* * * * *